(12) United States Patent
Yamashita

(10) Patent No.: US 7,940,083 B2
(45) Date of Patent: May 10, 2011

(54) SEMICONDUCTOR INTEGRATED CIRCUIT

(75) Inventor: Keitaro Yamashita, Kobe (JP)

(73) Assignee: Chimei Innolux Corporation, Miao-Li County (TW)

( * ) Notice: Subject to any disclaimer, the term of this patent is extended or adjusted under 35 U.S.C. 154(b) by 165 days.

(21) Appl. No.: 12/177,684

(22) Filed: Jul. 22, 2008

(65) Prior Publication Data

US 2009/0027103 A1    Jan. 29, 2009

(30) Foreign Application Priority Data

Jul. 23, 2007    (JP) ................................. 2007-190536

(51) Int. Cl.
*H03K 19/0175*    (2006.01)
*H03K 19/094*    (2006.01)
*H03L 5/00*    (2006.01)

(52) U.S. Cl. ............... 326/82; 326/68; 326/85; 327/333

(58) Field of Classification Search .................... 326/68, 326/82–87; 327/333
See application file for complete search history.

(56) References Cited

U.S. PATENT DOCUMENTS

| | | | | |
|---|---|---|---|---|
| 3,984,703 A * | 10/1976 | Jorgensen | ..................... | 327/206 |
| 4,464,587 A * | 8/1984 | Suzuki et al. | ................. | 327/206 |
| 4,687,954 A * | 8/1987 | Yasuda et al. | ................. | 327/206 |
| 5,113,098 A * | 5/1992 | Teymouri | ..................... | 327/552 |
| 5,175,445 A * | 12/1992 | Kinugasa et al. | ............... | 326/87 |
| 5,194,767 A * | 3/1993 | Chao | .............................. | 326/70 |
| 5,341,033 A * | 8/1994 | Koker | ........................... | 327/206 |
| 5,349,246 A * | 9/1994 | McClure | ........................ | 326/22 |
| 5,602,496 A * | 2/1997 | Mahmood | ........................ | 326/71 |
| 5,886,556 A * | 3/1999 | Ganger et al. | ................. | 327/206 |
| 5,945,859 A * | 8/1999 | Pang | .............................. | 327/206 |
| 5,973,900 A * | 10/1999 | Sher | .............................. | 361/91.5 |
| 6,046,617 A * | 4/2000 | Hoeld | ........................... | 327/206 |
| 6,060,925 A * | 5/2000 | Chou | ............................. | 327/206 |
| 6,124,733 A * | 9/2000 | Sharpe-Geisler | ............... | 326/83 |
| 6,127,898 A * | 10/2000 | Naura | ............................. | 331/57 |
| 6,181,172 B1 * | 1/2001 | Callahan | ....................... | 327/143 |
| 6,356,099 B1 * | 3/2002 | Lee et al. | ......................... | 326/24 |
| 6,448,830 B1 * | 9/2002 | Chuang et al. | ................ | 327/205 |
| 6,549,048 B2 * | 4/2003 | Tailliet | .......................... | 327/205 |
| 6,624,678 B1 * | 9/2003 | Boutaud et al. | ............... | 327/206 |
| 6,690,222 B2 * | 2/2004 | Nair | .............................. | 327/205 |
| 7,268,604 B2 * | 9/2007 | Koo | ............................... | 327/206 |
| 7,652,520 B2 * | 1/2010 | Gatta | ............................ | 327/436 |
| 7,663,413 B2 * | 2/2010 | Jang | .............................. | 327/108 |
| 7,683,670 B2 * | 3/2010 | Cheng et al. | .................... | 326/83 |
| 7,710,160 B2 * | 5/2010 | Masleid et al. | ............... | 326/121 |

(Continued)

*Primary Examiner* — James H. Cho
*Assistant Examiner* — Matthew C. Tabler
(74) *Attorney, Agent, or Firm* — Tim Tingkang Xia; Morris, Manning & Martin, LLP

(57) ABSTRACT

A semiconductor integrated circuit capable of maintaining characteristics of transistors in a circuit including a plurality of cascade connected transistors. The circuit includes an inverter which has a series connection of P-MOS transistors and a pair of N-MOS transistors. The P-MOS transistor is connected to a high potential source $V_H$ and the N-MOS transistor is connected to a low potential source $V_L$. The gate of each MOS transistor is connected to an input signal line. The inverter circuit further includes a P-MOS transistor connected between a node and input signal line, and an N-MOS transistor connected between a node of the N-MOS transistors and the input signal line. The gates of the P-MOS transistor and the N-MOS transistor are connected to an output signal line of the inverter circuit.

17 Claims, 3 Drawing Sheets

U.S. PATENT DOCUMENTS

| | | | |
|---|---|---|---|
| 7,728,386 B2 * | 6/2010 | Kojima | 257/369 |
| 2004/0075468 A1 * | 4/2004 | Haskin | 326/83 |
| 2005/0206431 A1 * | 9/2005 | Fournel | 327/333 |
| 2005/0270079 A1 * | 12/2005 | Chen et al. | 327/333 |
| 2006/0049848 A1 * | 3/2006 | Dubey | 326/87 |
| 2006/0158224 A1 * | 7/2006 | Yan-Bin | 326/87 |

* cited by examiner

SEMICONDUCTOR INTEGRATED CIRCUIT

FIELD OF THE INVENTION

The present invention relates to a semiconductor integrated circuit, and more specifically, to a semiconductor integrated circuit for use as a peripheral driving circuit in a liquid crystal display (LCD).

DESCRIPTION OF RELATED ART

In order to miniaturize and reduce production cost for the LCD, developments have been made conventionally for technologies involving placement of integrating peripheral driving circuits on the same substrate as that of a LCD substrate.

The peripheral driving circuits can include a vertical driving circuit for scanning gates of thin film transistors (TFT), and a horizontal driving circuit for supplying a video signal on data bus lines. The peripheral driving circuits are normally fabricated by integrating poly-silicon thin film transistors (p-SiTFT).

Normally, high output voltages in excess of the logic voltage (5 volts or 3.3 volts), are required in a peripheral driving circuit for a LCD. For example, a vertical driving circuit for a LCD can require an output voltage in the range of 20 to 40 volts. Accordingly, a major challenge is to develop a high withstanding voltage circuit that can overcome such technical hurdles or problems encountered in the vertical driving circuit for a LCD.

In order to make a circuit withstand high voltage, one can improve withstanding voltage across the source-drain electrodes of a transistor to which the output voltage is directly applied, or to reduce voltage across the source-drain electrode of a transistor.

There is conventionally known technology which can reduce voltage to be applied to each transistor by connecting a plurality of transistors in series. For example, Japanese Patent Publication No. 10-223905 discloses a high withstanding voltage semiconductor integrated circuit in which a voltage to be applied across a TFT is equally divided to eliminate the differences in withstanding voltage on the circuit.

As described hereinabove, in a circuit having a plurality of transistors connected in series with one another, nodes of the plurality of transistors are in a floating condition when the transistors are non-conducting (OFF). Theoretically, potentials on the nodes of the transistors depend upon divided voltages when the transistors are conducting (ON). However, because of differences in characteristics of the transistors and the influence of a feed-through effect due to parasitic capacitances in the circuit, potentials on nodes of the transistors, when they are non-conducting, would differ from the divided voltages. Although no attention has been paid to the potentials on the floating nodes, there is a possibility that the difference between the potentials on the floating nodes and the gate potential approaches a threshold voltage of the transistors.

Incidentally, if a voltage that is slightly lower than a threshold voltage of a MOS transistor is applied between the gate and source of the transistor, a high electric field is developed at an area adjacent to the drain. It is known that the transistor characteristic would degrade if such a condition continues for a long period of time (i.e., several seconds).

Accordingly, in a circuit having a plurality of transistors connected in series, there is a possibility of degrading the transistor characteristic during the non-conducting (OFF) condition of the transistor.

BRIEF SUMMARY OF THE INVENTION

In consideration of the above circumstance in a circuit having a plurality of series connected transistors, it is an object of the present invention to provide a semiconductor integrated circuit that is capable of maintaining the transistor characteristic.

A semiconductor integrated circuit according to the present invention has a first MOS transistor, a second MOS transistor connected in series with the first MOS transistor, and a voltage application circuit for applying a predetermined voltage to the node of the first MOS transistor and the second MOS transistor at the time when both of the first MOS transistor and the second MOS transistor become non-conducting.

By clamping the potential of the node in the time period when both of the first MOS transistor and the second MOS transistor become non-conducting in the above-described manner, it is possible to prevent characteristic degradation of the MOS transistors due to application of a threshold voltage to the MOS transistors for a long time.

In the semiconductor integrated circuit according to the present invention, the voltage application circuit applies a voltage such that both of the first MOS transistor and the second MOS transistor do not conduct.

The voltage to be applied to the node in the non-conducting time period of the transistors is required to have a magnitude not to make the first MOS transistor and the second MOS transistors conducting. The construction of the present invention is able to set the voltage to an appropriate magnitude.

In the semiconductor integrated circuit according to the present invention, the voltage application circuit comprises a third MOS transistor which connected to the node by the source or the drain and connected to the gate of the first MOS transistor by the other one of the source and the drain.

This structure allows control of the node potential equal to the gate potential of the first MOS transistor when the transistors are non-conducting.

In the semiconductor integrated circuit according to the present invention, the gate of the third MOS transistor may be connected to an output signal line of the semiconductor integrated circuit.

This particular structure allows control of the third MOS transistor by utilizing the input signal line of the semiconductor integrated circuit.

In the semiconductor integrated circuit according to the present invention, the gate of the third MOS transistor may be connected to an output signal line of the semiconductor integrated circuit.

This particular configuration allows control of the third MOS transistor by utilizing the output signal line of the semiconductor integrated circuit.

In the semiconductor integrated circuit according to the present invention, the first MOS transistor and the second MOS transistor may be an amorphous silicon transistor or a poly-silicon transistor.

Since a MOS transistor made from amorphous silicon or poly-silicon badly suffers characteristic degradation due to threshold voltage, it is preferable to employ the configuration of the present invention.

An inverter circuit according to the present invention includes the above-mentioned semiconductor integrated circuit and the first MOS transistor and the second MOS transistor are connected between power supply voltages.

A buffer circuit according to the present invention includes the above-mentioned semiconductor integrated circuit and the first MOS transistor and the second MOS transistor are connected between power supply voltages.

A level shifter circuit according to the present invention includes the above-mentioned semiconductor integrated circuit and the first MOS transistor and the second MOS transistor are connected between power supply voltages.

The inverter circuit, the buffer circuit and the level shifter circuit with the above-mentioned semiconductor integrated circuit are able to prevent characteristic degradation of MOS transistors due to application of a threshold voltage to such MOS transistors for an extended period of time by clamping the node potential in the non-conducting (OFF) time period of the first MOS transistor and the second MOS transistor as is the case in the semiconductor integrated circuit that has been described hereinabove.

In addition, in the present invention mentioned above, the transistor may also be a MOS transistor. In the MOS transistor, although the property of the transistor would be deteriorated if a voltage slightly lower than the threshold voltage of the transistor is applied to the gate-source for a long time, according to the structure of the present invention, by fixing the potential of the node at the OFF period, the deterioration of the property of the MOS transistor can be efficiently inhibited.

A semiconductor integrated circuit according to another embodiment of the present invention has a first circuit device, a second circuit device connected to the first circuit device, and a voltage application circuit for applying a predetermined voltage to a node of the first circuit device and the second circuit device in the non-conducting (OFF) time period of both of the first circuit device and the second circuit device.

By controlling the potential on the node of the first circuit device and the second circuit device as mentioned hereinabove, it is possible to prevent characteristic degradation of the circuit devices due to setting to an unknown potential.

An inverter circuit according to another embodiment of the present invention has a first P-MOS transistor, a second P-MOS transistor, a first N-MOS transistor and a second N-MOS transistor connected in a series from a higher potential side toward a lower potential side, an input signal line connected commonly to the gates of these MOS transistors, an output signal line connected to a node of the second P-MOS transistor and the first N-MOS transistor, a third P-MOS transistor connected to a node of the first P-MOS transistor and the second P-MOS transistor, and a third N-MOS transistor connected to a node of the first N-MOS transistor and the second N-MOS transistor, wherein the source, the drain and the gate of the third P-MOS transistor are connected respectively to the input signal line, between the first P-MOS transistor and the second P-MOS transistor, and to the output signal line, while the source, the drain and the gate of the third N-MOS transistor are connected respectively to the input signal line, between the first N-MOS transistor and the second N-MOS transistor, and to the output signal line.

A buffer circuit according to another embodiment of the present invention has a first P-MOS transistor, a second P-MOS transistor, a first N-MOS transistor and a second N-MOS transistor connected in a series from a higher potential side toward a lower potential side, a first input signal line connected to the gate of the first P-MOS transistor, a second input signal line connected to the gate of the second P-MOS transistor, and the gate of the first N-MOS transistor, a third input signal line connected to the gate of the second N-MOS transistor, a third N-MOS transistor connected to a node of the first P-MOS transistor and the second P-MOS transistor, and a third P-MOS transistor connected to a node of the first N-MOS transistor and the second N-MOS transistor, wherein the source, the drain and the gate of the third N-MOS transistor are connected respectively to the second input signal line, between the first P-MOS transistor and the second P-MOS transistor, and to the first input signal line, while the source, the drain and the gate of the third P-MOS transistor are connected respectively to the second input signal line, between the first N-MOS transistor and the second N-MOS transistor, and to the third input signal line.

A level shifter circuit according to another embodiment of the present invention has a first P-MOS transistor, a second P-MOS transistor and a first N-MOS transistor connected in a series from a higher potential side toward a lower potential side, a first input signal line connected to the gate of the second P-MOS transistor and the gate of the first N-MOS transistor, a first output signal line connected to a node of the second P-MOS transistor and the first N-MOS transistor, a third P-MOS transistor, a fourth P-MOS transistor and a second N-MOS transistor connected in a series from a higher potential side toward a lower potential side, a second input signal line connected to the gate of the fourth P-MOS transistor and the gate of the second N-MOS transistor, a second output signal line connected to a node of the fourth P-MOS transistor and the second N-MOS transistor, a third N-MOS transistor connected to a node of the first P-MOS transistor and the second P-MOS transistor, and a fourth N-MOS transistor connected to a node of the third P-MOS transistor and the fourth P-MOS transistor, wherein the source, the drain and the gate of the third N-MOS transistor are connected respectively to the first input signal line, between the first P-MOS transistor and the second P-MOS transistor and to the gate of the first P-MOS transistor as well as the second output signal line, while the source, the drain and the gate of the fourth N-MOS transistor are connected respectively to the second input signal line, between the third P-MOS transistor and the fourth P-MOS transistor and to the gate of the third P-MOS transistor as well as the first output signal line.

A level shifter circuit according to another embodiment of the present invention has a first N-MOS transistor, a second N-MOS transistor and a first P-MOS transistor connected in series from a low potential side toward a high potential side, a first input signal line connected to the gate of the second N-MOS transistor and the gate of the first P-MOS transistor, a first output signal line connected to a node of the second N-MOS transistor and the first P-MOS transistor, a third N-MOS transistor, a fourth N-MOS transistor and a second P-MOS transistor connected in a series from a low potential side toward a high potential side, a second input signal line connected to the gate of the fourth N-MOS transistor and the gate of the second P-MOS transistor, a second output signal line connected to a node of the fourth N-MOS transistor and the second P-MOS transistor, a third P-MOS transistor connected to a node of the first N-MOS transistor and the second N-MOS transistor, and a fourth P-MOS transistor connected to a node of the third N-MOS transistor and the fourth N-MOS transistor, wherein the source, the drain and the gate of the third P-MOS transistor are connected respectively to the first input signal line, between the first N-MOS transistor and the second N-MOS transistor, and the gate of the first N-MOS transistor as well as the second output signal line, while the source, the drain and the gate of the fourth P-MOS transistor are connected respectively to the second input signal line, between the third N-MOS transistor and the fourth N-MOS transistor, and to the gate of the third N-MOS transistor as well as the first output signal line.

Electronic device according to the present invention has a display panel including the above-mentioned semiconductor integrated circuit and a power supply connected to the display panel for supplying electrical power to the display panel.

Such construction prevents transistor characteristics from degrading due to application of a threshold voltage to the transistors for an extended period of time similar to the case of the semiconductor integrated circuit.

The above-mentioned electronic device may be a mobile phone, a digital camera, a personal data assistant (PDA), a notebook computer, a desktop computer, a television set, a Global Positioning System (GPS), an automobile display, an aircraft display, a digital photo frame or a portable DVD player.

According to the present invention, transistor characteristic degradation due to application of threshold voltage to MOS transistors for an extended period of time can be prevented because the node potential of the first MOS transistor and the second MOS transistor is clamped in the non-conducting (OFF) time of the first MOS transistor and the second MOS transistor.

DETAILED DESCRIPTION OF THE EXEMPLARY EMBODIMENTS

Now, a semiconductor integrated circuit according to an embodiment of the present invention will be described with reference to the accompanying drawings. Although a semiconductor integrated circuit using MOS transistors are described in this embodiment, it is to be noted that the present invention can also be applied to any circuit using transistors, diodes or the like other than MOS transistors. Also, it is to be noted that the MOS transistors to be described hereinafter may be p-Si TFTs or a-Si TFTs.

Figure 1:
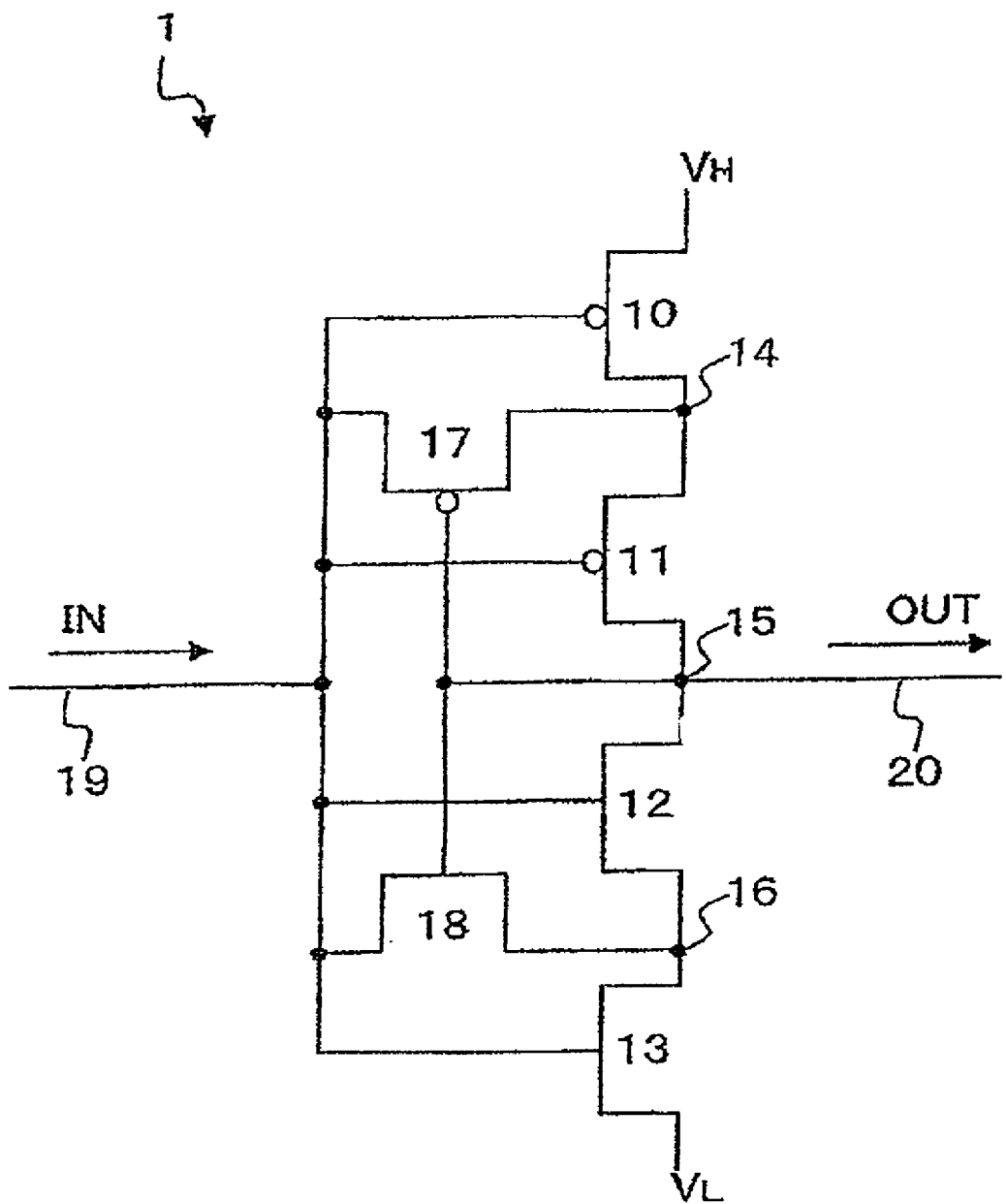
FIG. 1 is a schematic circuit diagram according a first embodiment of a semiconductor integrated circuit.

FIG. 1 is a schematic circuit diagram according to a first embodiment of a semiconductor integrated circuit. The circuit as shown in FIG. 1 is an inverter circuit 1 using double gate TFTs (Thin Film Transistors). The inverter circuit 1 includes a series connection of a P-MOS transistor 10, a P-MOS transistor 11, an N-MOS transistor 12 and an N-MOS transistor 13. The P-MOS transistor 10 is connected to a high potential source $V_H$ and the N-MOS transistor 13 is connected to a low potential source $V_L$. The gate of each MOS transistor 10~13 is connected to an input signal line 19. An output signal line 20 is connected to a node of the P-MOS transistor 11 and the N-MOS transistor 12.

The inverter circuit 1 further includes a P-MOS transistor 17 which connected to a node 14 of the P-MOS transistor 10 and the P-MOS transistor 11 and the input signal line 19, and an N-MOS transistor 18 which connected to a node 16 of the N-MOS transistor 12 and the N-MOS transistor 13 and the input signal line 19. The gates of the P-MOS transistor 17 and the N-MOS transistor 18 are connected to the output signal line 20.

Now, the operation of the first embodiment of the inverter circuit 1 will be described hereunder. When a High signal is inputted to the input signal line 19, the P-MOS transistors 10, 11 turn OFF, while the N-MOS transistors 12, 13 turn ON. As a result, a low potential $V_L$ is outputted from the output signal line 20. Since the output signal or the low potential $V_L$ on the output signal line 20 is outputted at this time to the gate of the P-MOS transistor 17 which is connected to the node 15, the P-MOS transistor 17 turns ON. Thus, the potential on the node 14 is equal to the potential $V_H$ on the input signal line 19 and the source-gate potential difference of the P-MOS transistor 11 is equal to 0.

On the contrary to the foregoing, when a Low signal is inputted to the input signal line 19 of the inverter circuit 1, the P-MOS transistors 10, 11 turn ON, while the N-MOS transistors 12, 13 turn OFF. As a result, since the output signal equal to the high potential $V_H$ on the output signal line 20 is inputted at this time to the gate of the N-MOS transistor 18 that is connected to the node 15, the N-MOS transistor 18 turns ON. The potential on the node 16 is equal to the potential $V_L$ on the input signal line 19, thus the source-gate potential difference of the N-MOS transistor 12 is equal to 0.

In this embodiment of the inverter circuit 1 as described hereinabove, the potential on the node 14 is equal to the potential on the input signal line 19 when the P-MOS transistors 10, 11 turn OFF, while it is equal to the potential on the node 16 when the N-MOS transistors 12, 13 turn OFF. As a result, it is possible to prevent characteristic degradation of the MOS transistors due to application of a voltage close to the threshold voltage between the source-gate for an extended period of time.

Figure 2:
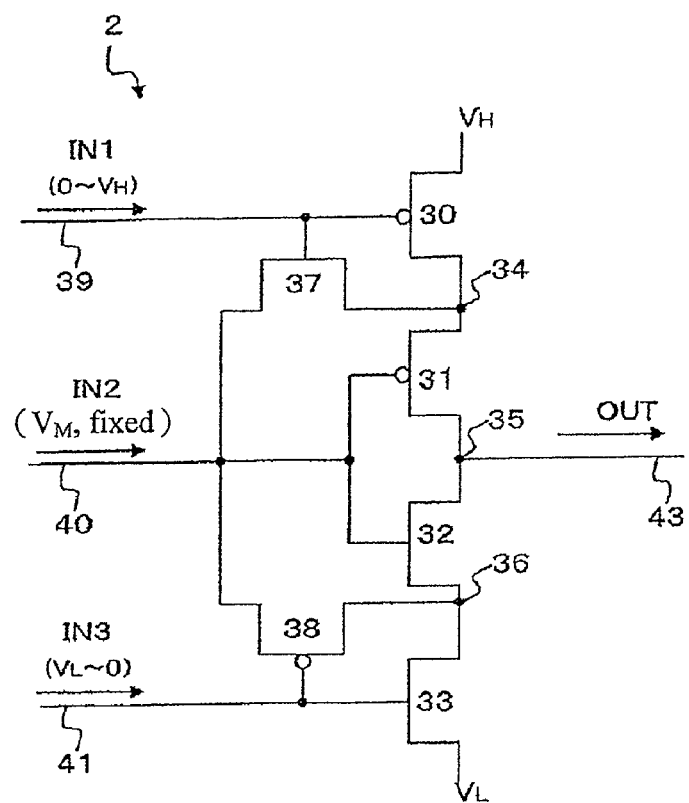
FIG. 2 is a schematic circuit diagram according to a second embodiment of a semiconductor integrated circuit.

FIG. 2 is a schematic circuit diagram according to a second embodiment of the semiconductor integrated circuit. The circuit as shown in FIG. 2 is a buffer circuit 2. The buffer circuit 2 includes a series connection of a P-MOS transistor 30, a P-MOS transistor 31, an N-MOS transistor 32 and an N-MOS transistor 33. The P-MOS transistor 30 is connected to a high potential source $V_H$ and the N-MOS transistor 33 is connected to a low potential source $V_L$. The gate of the P-MOS transistor 30 is connected to a first input signal line 39, the gates of the P-MOS transistor 31 and the N-MOS transistor 32 are connected to a second input signal line 40, and the gate of the N-MOS transistor 33 is connected to a third input signal line 41. An output signal line 43 is connected to a node 35 of the P-MOS transistor 31 and the N-MOS transistor 32.

The buffer circuit 2 further includes an N-MOS transistor 37 connected between a node 34 of the P-MOS transistors 30, 31 and the second input signal line 40, and a P-MOS transistor 38 connected between a node 36 of the N-MOS transistors 32, 33 and the third input signal line 41.

An input signal IN1 in the range of 0~$V_H$ is inputted to the first input signal line 39. An input signal IN2 of $V_M$ is inputted to the second input signal line 40. An input signal IN3 in the range of $V_L$~0 is inputted to the third input signal line 41. It is to be noted here that the input signals inputted to the input signal lines 39~41 have the relationship: $V_H$>$V_M$>$V_L$. Common mode signals are inputted to the first input signal line 39 and the third input signal line 41. In other words, when a High signal ($V_H$) is inputted to the first input signal line 39, a High signal (0) is also inputted to the third input signal line 41. On the other hand, when a Low signal (0) is inputted to the first input signal line 39, a Low signal ($V_L$) is also inputted to the third input signal line 41.

Now, the operation of the second embodiment or the buffer circuit 2 will be described hereinafter. When High signals are inputted to the first input signal line 39 and the third input signal line 41, the P-MOS transistors 30, 31 turn OFF, while the N-MOS transistors 32, 33 turn ON, thereby outputting the low potential $V_L$ from the output signal line 43. Additionally, the N-MOS transistor 37 turns ON and the P-MOS transistor 38 turns OFF. As a result, the potential on the node 34 is equal to the potential $V_H$ on the first input signal line 39, and the potential difference between the source-gate of the P-MOS transistor 39 is equal to 0.

On the contrary to the foregoing, when the Low signals are inputted to the first input signal line 39 and the third input signal line 41, the P-MOS transistors 30, 31 turn ON, while the N-MOS transistors 32, 33 turn OFF, thereby outputting the high potential $V_H$ from the output signal line 43. Additionally, the N-MOS transistor 37 turns OFF and the P-MOS transistor 38 turns ON. At this time, the potential on the node 36 is equal to the potential $V_L$ on the third input signal line 41, thereby making the potential difference between the source-gate of the N-MOS transistor 32 equal to 0.

As described hereinabove, the embodiment of the buffer circuit 2 maintains the potential on the node 34 equal to the potential on the first input signal line 39 when the P-MOS transistors 30, 31 are OFF or non-conducting, while maintaining the potential on the node 36 equal to the potential on the third input signal line 41 when the N-MOS transistors 32, 33 are OFF or non-conducting. As a result, it is possible to prevent characteristic degradation of MOS transistors due to application of a threshold voltage between the source-gate electrodes for an extended period of time.

Figure 3:
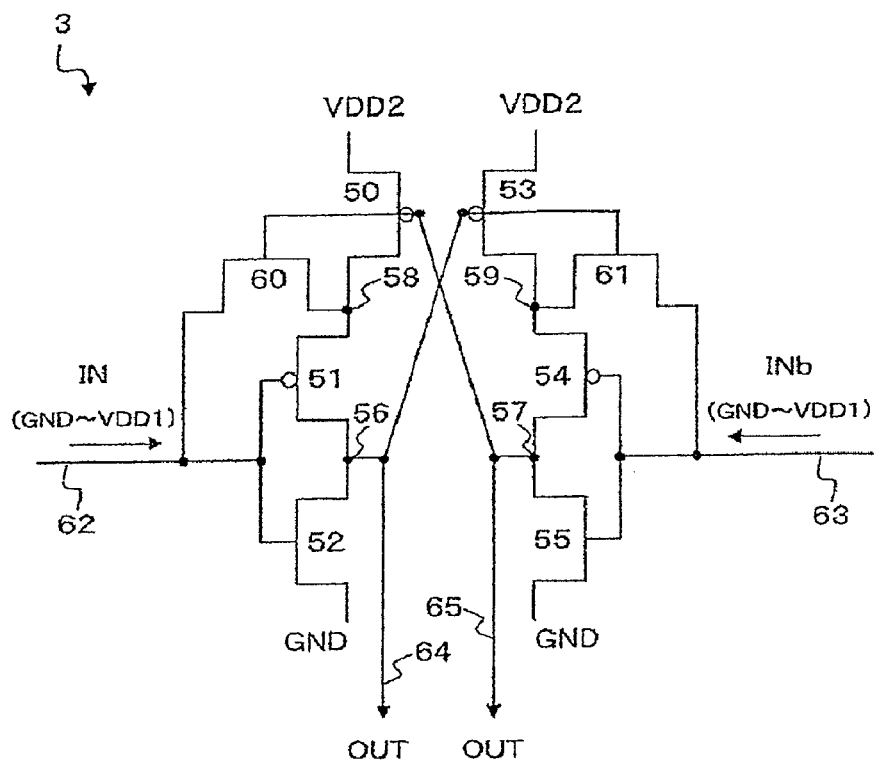
FIG. 3 is a schematic circuit diagram according to a third embodiment of a semiconductor integrated circuit.

FIG. 3 is a schematic circuit diagram according to a third embodiment of the semiconductor integrated circuit. The circuit as shown in FIG. 3 is a level shifter circuit 3. The level shifter circuit 3 is a circuit for providing a voltage range or amplitude GND~VDD2 from an input signal in the range of GND~VDD1. In other words, the level shifter circuit 3 performs an amplitude conversion of the potential at the high potential side while clamping the low potential side.

The level shifter circuit 3 has a series connection of a P-MOS transistor 50, a P-MOS transistor 51 and an N-MOS transistor 52. The P-MOS transistor 50 is connected to a power supply voltage VDD2, while the N-MOS transistor 52 is returned to ground (GND).

The level shifter circuit 3 further includes a series connection of a P-MOS transistor 53, a P-MOS transistor 54 and an N-MOS transistor 55. The P-MOS transistor 43 is connected to a power supply voltage VDD2, while the N-MOS transistor 55 is returned to ground.

The gates of the P-MOS transistor 51 and the N-MOS transistor 52 are connected to a first input signal line 62. Similarly, the gates of the P-MOS transistor 54 and the N-MOS transistor 55 are connected to a second input signal line 63. Inverted signals are inputted to the first input signal line 62 and the second input signal line 63. In other words, when a High signal is inputted to either one of the first input signal line 62 and the second input signal line 63, a Low signal is inputted to the other input signal line.

an output signal line 64 and the gate of the P-MOS transistor 53 are connected to a node of the P-MOS transistor 51 and the N-MOS transistor 52. Similarly, an output signal line 65 and the gate of the P-MOS transistor 50 are connected to a node 57 of the P-MOS transistor 54 and the N-MOS transistor 55. The above circuit configuration is the same as a conventional level shifter circuit.

The embodiment of the level shifter circuit 3 further includes an N-MOS transistor 60 connected between a node 58 of the P-MOS transistor 50 and the P-MOS transistor 51 and the input signal line 62. The source and the drain of the N-MOS transistor 60 are connected to the input signal line 62 and the node 58, respectively. The gate of the N-MOS transistor 60 is connected to the gate of the P-MOS transistor 50 and to the output signal line 65. The level shifter circuit 3 further includes an N-MOS transistor 61 connected between a node 59 of the P-MOS transistor 53 and the P-MOS transistor 54 and the input signal line 63. The source and the drain of the N-MOS transistor 61 are connected to the input signal line 63 and the node 59. The gate of the N-MOS transistor 61 is connected to the gate of the P-MOS transistor 53 and to the output signal line 64.

Now, the operation of the embodiment of the level shifter circuit 3 will be described. When a High signal is inputted to the input signal line 62, the N-MOS transistor 52 turns ON, while the P-MOS transistor 51 turns OFF. As a result, the potential on the output signal line 64 is equal to GND and is inputted to the gates of the P-MOS transistor 53 and the N-MOS transistor 61. Since GND or a Low signal is inputted, the P-MOS transistor 53 turns ON, while the N-MOS transistor 61 turns OFF.

The High signal is inputted to the input signal line 62 and the Low signal is inputted to the input signal line 63. As a result, the P-MOS transistor 54 turns ON and the N-MOS transistor 55 turns OFF. Since both of the P-MOS transistors 53, 54 are ON, the potential on the node 57 is equal to VDD2 and such potential is outputted from the output signal line 65.

Also, the potential on the node 57 is inputted to the P-MOS transistor 50 and the N-MOS transistor 60. Since VDD2 or a High voltage is inputted herein, the P-MOS transistor 50 turns OFF, while the N-MOS transistor 60 turns ON. Then, the source-drain electrodes of the N-MOS transistor 60 become conducting, thereby making the potential on the node 58 equal to the potential VDD on the input signal line 62 and the potential difference between the source-gate of the P-MOS transistor 51 equal to 0.

It is to be noted that the above-mentioned operation is completely reversed when a High signal is inputted to the input signal line 63.

As apparent from the above description, in the embodiment of the level shifter circuit 3, the potential on the node 58 is equal to the potential on the input signal line 62 when the P-MOS transistors 50, 51 are turned OFF, thereby preventing characteristic degradation due to application of a voltage close to the threshold voltage between the source-gate electrodes of the P-MOS transistor 51 for an extended period of time.

Figure 4:
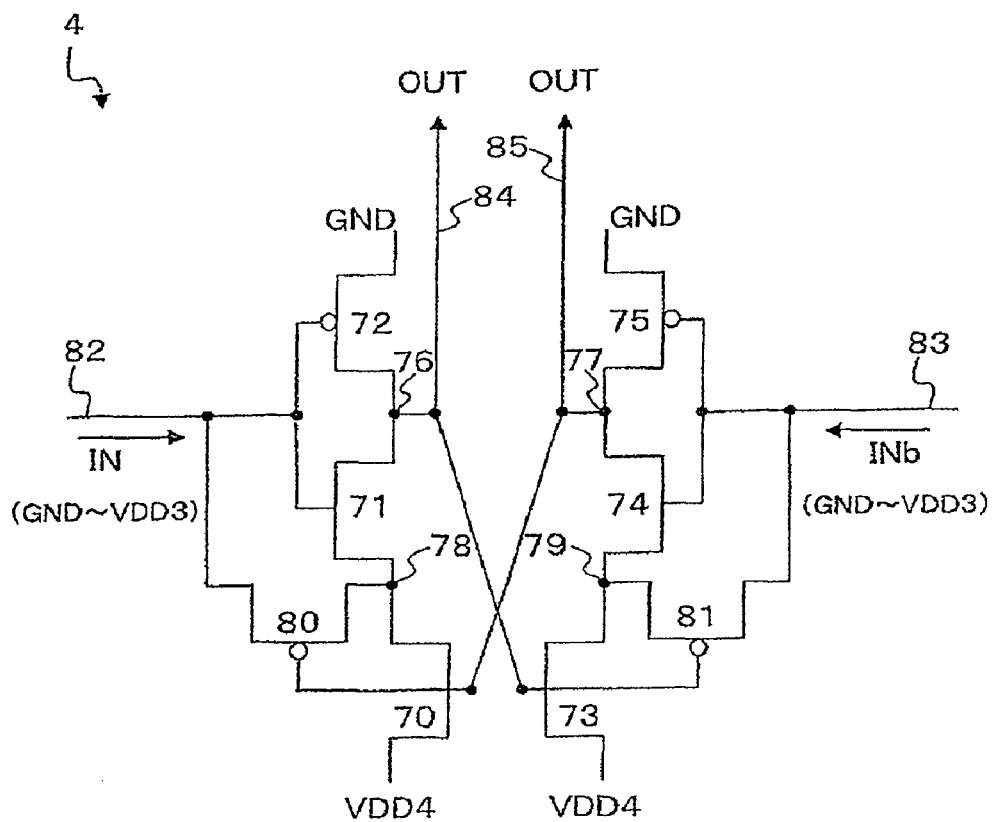
FIG. 4 is a schematic circuit diagram according to a fourth embodiment of a semiconductor integrated circuit.

FIG. 4 is a schematic circuit diagram according to a fourth embodiment of the semiconductor integrated circuit. The circuit as shown in FIG. 4 is a level shifter circuit 4.

The level shifter circuit 4 is a circuit for providing a voltage amplitude in the range of GND~VDD4 from an input signal having the voltage amplitude in the range of GND~VDD3. Unlike the level shifter circuit 3, the level shifter circuit 4 clamps the high potential side and performs a voltage conversion of the potential at the low potential side.

The level shifter circuit 4 includes a series connection of an N-MOS transistor 70, an N-MOS transistor 71 and a P-MOS transistor 72. The N-MOS transistor 70 is connected to a power supply voltage VDD4 and the P-MOS transistor 72 is returned to ground (GND).

The level shifter circuit 4 further includes a series connection of an N-MOS transistor 73, an N-MOS transistor 74 and a P-MOS transistor 75. The N-MOS transistor 73 is connected to the power supply voltage VDD4 and the P-MOS transistor 75 is returned to ground.

The gates of the N-MOS transistor 71 and the P-MOS transistor 72 are connected to a first input signal line 82. Similarly, the gates of the N-MOS transistor 74 and the P-MOS transistor 75 are connected to a second input signal line 83. Inverted signals are inputted to the first input signal line 82 and the second input signal line 83. In other words, when a High signal is inputted to either one of the first input signal line 82 and the second input signal line 83, a Low signal is applied to the other input signal line.

an output signal line 84 and the gate of the N-MOS transistor 73 are connected to a node 76 of the N-MOS transistor 71 and the P-MOS transistor 72. Similarly, an output signal line 85 and the gate of the N-MOS transistor 70 are connected to a node 77 of the N-MOS transistor 74 and the P-MOS transistor 75. The above-mentioned circuit configuration is the same as a conventional level shifter circuit.

The embodiment of the level shifter circuit 4 further includes a P-MOS transistor 80 connected between a node 78 of the N-MOS transistor 70 and the N-MOS transistor 71. The source and the drain of the P-MOS transistor 80 are connected to the first input signal line 82 and the node 78, respectively. The gate of the P-MOS transistor 80 is connected to the gate of the N-MOS transistor 70 and to the output signal line 85. It further includes a P-MOS transistor 81 connected between the node 79 of the N-MOS transistor 73 and the N-MOS transistor 74 and the second input signal line 83. The source and the drain of the P-MOS transistor 81 are connected to the input signal line 83 and the node 79, respectively. The gate of the P-MOS transistor 81 is connected to the gate of the N-MOS transistor 73 and also to the output signal line 84.

Now, the operation of the fourth embodiment of the level shifter circuit 4 will be described. When a Low signal is inputted to the input signal line 82, the P-MOS transistor 72 turns ON and the N-MOS transistor 71 turns OFF. As a result, the potential on the node 76 is equal to GND and the potential is outputted from the output signal line 84. The potential on the node 76 is also inputted to the gates of the N-MOS transistor 73 and the P-MOS transistor 81. Since GND or a High signal is inputted at this time, the N-MOS transistor 73 turns ON and the P-MOS transistor 81 turns OFF.

In addition to inputting a Low signal to the input signal line 82, a High signal is inputted to the input signal line 83, thereby turning ON the N-MOS transistor 74 and turning OFF the P-MOS transistor 75. Since both N-MOS transistors 73, 74 turn ON, the potential on the node 77 is equal to VDD4 and the potential is outputted from the output signal line 85.

Also, the potential on the node 77 is inputted to the gates of the N-MOS transistor 70 and the P-MOS transistor 80. Since VDD4 or a Low signal is inputted, the N-MOS transistor 70 turns OFF and the P-MOS transistor 80 turns ON. As a result, the source-drain electrodes of the P-MOS transistor 80 becomes conducting and the potential on the node 78 is equal to the potential on the input signal line 82, thereby making the potential difference between the source and gate of the N-MOS transistor 71 equal to 0.

It is to be noted that the above-mentioned operation is completely reversed when a High signal is inputted to the input signal line 82.

As described hereinabove, when the N-MOS transistors 70, 71 are OFF in the embodiment of the level shifter circuit 4, the potential on the node 78 is equal to the potential on the input signal line 82, thereby preventing characteristic degradation due to application of a voltage close to a threshold voltage between the source-gate of the N-MOS transistor 71 for an extended period of time.

Figure 5:
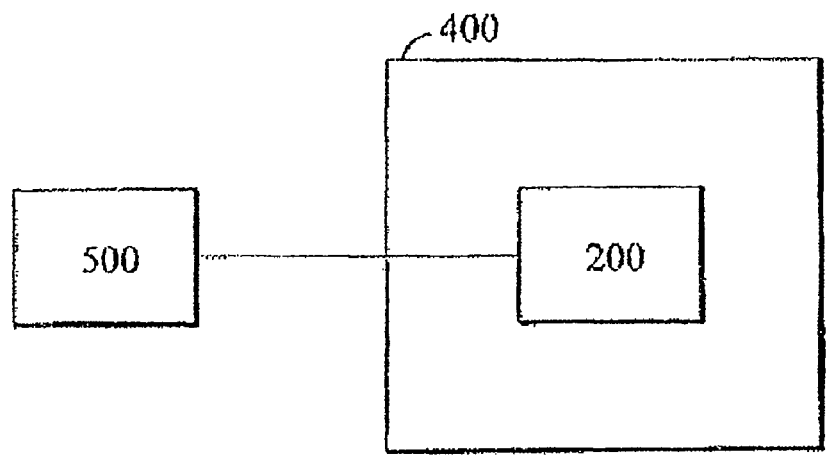
FIG. 5 is a block diagram showing an embodiment of electronic device.

FIG. 5 shows a construction for an embodiment of an electronic device 600. As shown in FIG. 5, the electronic device 600 includes a display panel 400 and a power supply 500. The display panel 400 has a semiconductor integrated circuit 200. The semiconductor integrated circuit 200 may be the inverter circuit 1, the buffer circuit 2, the level shifter circuit 3 or the level shifter circuit 4 that have been described hereinabove. The power supply 500 is operationally connected to the display panel 400 for supplying electrical power thereto. The electronic device 600 may be, for example, a cellular phone, a digital camera, a Personal Data Assistant (PDA), a notebook PC, a desktop PC, a television set, a Global Positioning System (GPS), an automobile display, an aircraft display, a digital photo frame, a portable DVD player, etc.

Although embodiments of the semiconductor integrated circuit according to the present invention have been described in detail hereinabove, it is to be noted that the present invention should not be restricted to the foregoing embodiments. The present invention can be applied to various semiconductor integrated circuits including any circuit in which a plurality of MOS transistors are connected.

Although described in the above embodiment is to apply a predetermined voltage to the node of MOS transistors, it is possible to apply a predetermined voltage to a node of circuit devices other than MOS transistors so that the node does not become floating.

As understood from the above description, the present invention exhibits an advantage to prevent characteristic degradation of cascade connected MOS transistors. The present invention finds particular usefulness when used in semiconductor integrated circuits or the like, for example, for a peripheral driving circuit for a liquid crystal display.

What is claimed is:

1. A semiconductor integrated circuit comprising:
   a first transistor;
   a second transistor connected in series with the first transistor; and
   a voltage application circuit for applying a predetermined voltage to a node of the first transistor and the second transistor in a time period when both of the first transistor and the second transistor are non-conducting, wherein the voltage application circuit comprises a third transistor which is connected to the node by a source or a drain and connected to a gate of the first transistor by the other one of the source and the drain, wherein the gate of the third transistor is connected to an output signal line of the semiconductor integrated circuit.

2. The semiconductor integrated circuit of claim 1, wherein the voltage application circuit applies a voltage such that both of the first transistor and the second transistor do not conduct.

3. The semiconductor integrated circuit of claims 1, wherein the first transistor and the second transistor are amorphous silicon transistor or a poly silicon transistor.

4. The semiconductor integrated circuit of claim 1, further comprising a power supply voltage terminal, which is connected between the first transistor and the second transistor so that the semiconductor integrated circuit forms an inverter circuit.

5. The semiconductor integrated circuit of claim 1, further comprising a power supply voltage terminal, which is connected between the first transistor and the second transistor so that the semiconductor integrated circuit forms a buffer circuit.

6. The semiconductor integrated circuit of claim 1, further comprising a power supply voltage terminal, which is connected between the first transistor and the second transistor so that the semiconductor integrated circuit forms a level shifter circuit.

7. A semiconductor integrated circuit comprising:
   a first circuit element;
   a second circuit element connected to the first circuit element; and
   a voltage application circuit for applying a predetermined voltage to a node of the first circuit element and the second circuit element in a time period when both of the first circuit element and the second circuit element are non-conducting, wherein the voltage application circuit comprises a third circuit element which is connected to the node by a source or a drain and connected to a gate of the first circuit element by the other one of the source and the drain, wherein the gate of the third transistor is connected to an output signal line of the semiconductor integrated circuit.

8. The semiconductor integrated circuit of claim 7, wherein the semiconductor integrated circuit is an inverter circuit, and the first circuit element is a first P-type MOS transistor and the second circuit element is a second P-type MOS transistor, the semiconductor integrated circuit further comprises a first N-type MOS transistor and a second N-type MOS transistor, and the third circuit element comprises a third P-type MOS transistor and a third N-type MOS transistor, wherein the first P-type MOS transistor, the second P-type MOS transistor, the first N-type MOS transistor and the second N-type MOS transistor of the inverter circuit are connected in series sequentially from a higher potential side to a lower potential side, and the third P-type MOS transistor connected to the node of the first P-type MOS transistor and the second P-type MOS transistor, and the third N-type MOS transistor connected to the node of the first N-type MOS transistor and the second N-type MOS transistor.

9. The semiconductor integrated circuit of claim 8, further comprising:
an input signal line connected to the gate of the first and second P-type MOS transistors and the Rate of the first and second N-type MOS transistors; and
an output signal line connected to the node of the second P-type MOS transistor and the first N-type MOS transistor;
wherein, a source of the third P-type MOS transistor is connected to the input signal line, a drain of the third P-type MOS transistor is connected between the first P-type MOS transistor and the second P-type MOS transistor, and the gate of the third P-type MOS transistor is connected to the output signal line; and
a source of the third N-type MOS transistor is connected to the input signal line, a drain of the third N-type MOS transistor is connected between the first N-type MOS transistor and the second N-type MOS transistor, and the gate of the third N-type MOS transistor is connected to the output signal line.

10. The semiconductor integrated circuit of claim 7, wherein the semiconductor integrated circuit is a buffer circuit, and the first transistor comprises a first Ptype MOS transistor and a second P-type MOS transistor, the second transistor comprises a first N-type MOS transistor and a second N-type MOS transistor, and the voltage application circuit comprises a third N-type MOS transistor and a third P-type MOS transistor, wherein the first Ptype MOS transistor, the second P-type MOS transistor, the first N-type MOS transistor and the second N-type MOS transistor are connected in series sequentially from a higher potential side to a lower potential side, and the third N-type MOS transistor connected to the node of the first P-type MOS transistor and the second P-type MOS transistor; the third P-type MOS transistor connected to the node of the first N-type MOS transistor and the second N-type MOS transistor.

11. The semiconductor integrated circuit of claim 10, further comprising:
a first signal line connected to the gate of the first P-type MO S transistor;
a second input signal line connected to the gate of the second P-type MOS transistor and the gate of the first N-type MOS transistor; and
a third input signal line connected to the gate of the second N-type MO S transistor;
wherein the source of the third N-type MOS transistor is connected to the second input signal line, the drain is connected between the first P-type MOS transistor and the first P-type MOS transistor, and the gate is connected the first input signal line; and the source of the third P-type MOS transistor is connected to the second input signal line, the drain is connected between the first N-type MOS transistor and the second N-type MOS transistor, and the gate is connected to the third input signal line.

12. The semiconductor integrated circuit of claim 7, wherein the semiconductor integrated circuit is a level shifter circuit, and the first circuit element comprises a first P-type MOS transistor, a P-type MOS transistor and a first N-type MOS transistor, the second circuit element comprises a third P-type MOS transistor, a fourth P-type MOS transistor and a second N-type MOS transistor, and the voltage application circuit comprises a third N-type MOS transistor and a fourth N- type MOS transistor, wherein the first p-type MOS transistor, the second P-type MOS and the first N- type MOS transistor are connected in series sequentially from a higher potential side to a lower potential side;
the third P-type MOS transistor, the fourth P-type MOS transistor and the second N-type MOS transistor connected in series sequentially from a higher potential side to a lower potential side; and
the third N-type MOS transistor connected to the node of the first P-type MOS transistor and the second P-type MOS transistor, and the fourth N-type MOS transistor connected to the node of the third P-type MOS transistor and the fourth P-type MOS transistor.

13. The semiconductor integrated circuit of claim 12, further comprising:
a first input signal line connected to the gates of the second P-type MOS transistor and the first N-type MOS transistor;
a first output signal line connected to the node of the second P-type MOS transistor and the first N-type MOS transistor; a second input signal line connected to the gates of the fourth P-type MOS transistor and the second N-type MOS transistor; and a second output signal line connected to the node of the fourth P-type MOS transistor and the second N-type MOS transistor, wherein the source of the third N-type MOS transistor is connected to the first input signal line, the drain is connected between the first P-type MOS transistor and the second P-type MOS transistor, and the gate is connected to the gate of the first P-type MOS transistor and also to the second output signal line; and the source of the fourth N-type MOS transistor is connected to the second input signal line, the drain is connected between the third P-type MOS transistor and the fourth P-type MOS transistor, and the gate is connected to the gate of the third P-type MOS transistor and also to the first output signal line.

14. The semiconductor integrated circuit of claim 7, wherein the semiconductor integrated circuit is a level shifter circuit, and the first circuit element comprises a first N-type MOS transistor, a second N-type MOS transistor and a first P-type MOS transistor, the second circuit element comprises a third N-type MOS transistor, a fourth N-type MOS transistor and a second P- type MOS transistor, and the voltage application circuit comprises a third P-type MOS transistor and a fourth P-type MOS transistor, wherein the first N-type MOS transistor, the second N-type MOS transistor and the first P-type MOS transistor connected in series sequentially from a higher potential side to a lower potential side;

the third N-type MOS transistor, the fourth N-type MOS transistor and the second P-type MOS transistor connected in series sequentially from a higher potential side to a lower potential side; and the third P-type MOS transistor connected to the node of the first N-type MOS transistor and the second N-type MOS transistor, and the fourth P-type MOS transistor connected to the node of the third N-type MOS transistor and fourth N-type MOS transistor.

15. The semiconductor integrated circuit of claim 14, further comprising:

a first input line connected between the gates of the second N-type MOS transistor and the first P-type MOS transistor;

a first output signal line connected to the node of the second N-type MOS transistor and the first P-type MOS transistor;

a second input signal line connected to the gates of the fourth N-type MOS transistor and the second P-type MOS transistor; and a second output signal line connected to the node of the fourth N-type MOS transistor and the second P-type MOS transistor, wherein the source of the third P-type MOS transistor is connected to the first input signal line, the drain is connected between the first N-type MOS transistor and the second N-type MOS transistor, and the gate is connected to the gate of the first N-type MOS transistor and also to the second output signal line; and the source of the fourth P-type MOS transistor is connected to the second input signal line, the drain is connected between the third N-type MOS transistor and the fourth N-type MOS transistor and the gate is connected to the gate of the third N-type MOS transistor and also to the first output signal line.

16. An electronic device comprising:

a display panel including a semiconductor integrated circuit of claims 1; and a power supply coupled to the display panel for providing power to the display panel.

17. The electronic device of claim 16, which includes a mobile phone, digital camera, a personal data assistant (PDA), a notebook computer, a desktop computer, a television, a Global Positioning System (GPS), an automotive display, an avionics display, a digital photo frame or a portable DVD player.

* * * * *